(12) United States Patent
Park

(10) Patent No.: US 11,496,656 B2
(45) Date of Patent: Nov. 8, 2022

(54) CAMERA MODULE ADJUSTING A DRIVING VOLTAGE APPLIED TO A LIQUID LENS BASED ON A FEEDBACK SIGNAL

(71) Applicant: LG INNOTEK CO., LTD., Seoul (KR)

(72) Inventor: Yong Sung Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 594 days.

(21) Appl. No.: 16/479,871

(22) PCT Filed: Jan. 23, 2018

(86) PCT No.: PCT/KR2018/000988
§ 371 (c)(1),
(2) Date: Jul. 22, 2019

(87) PCT Pub. No.: WO2018/135924
PCT Pub. Date: Jul. 26, 2018

(65) Prior Publication Data
US 2021/0409580 A1  Dec. 30, 2021

(30) Foreign Application Priority Data

Jan. 23, 2017  (KR) .................. 10-2017-0010539

(51) Int. Cl.
*H04N 5/225* (2006.01)
*G02B 3/14* (2006.01)
(Continued)

(52) U.S. Cl.
CPC ............ *H04N 5/2253* (2013.01); *G02B 3/14* (2013.01); *H04N 5/2252* (2013.01);
(Continued)

(58) Field of Classification Search
CPC ......................................... H05K 2201/10121
See application file for complete search history.

(56) References Cited

U.S. PATENT DOCUMENTS

2008/0267603 A1* 10/2008 Jung ................... G02B 7/021
396/111
2009/0103185 A1   4/2009 Helwegen et al.
(Continued)

FOREIGN PATENT DOCUMENTS

CN    101057169 A    10/2007
CN    101713861 A    5/2010
(Continued)

*Primary Examiner* — Gary C Vieaux
(74) *Attorney, Agent, or Firm* — Birch, Stewart, Kolasch & Birch, LLP

(57) ABSTRACT

A camera module according to one embodiment of the present invention comprises: a first plate comprising a cavity in which a conductive liquid and a non-conductive liquid forming an interface are disposed; a common terminal disposed on the first plate; a plurality of individual terminals disposed below the first plate; a second plate disposed on the common terminal; a liquid lens comprising a third plate disposed below the individual terminals; a lens assembly comprising at least one solid lens and the liquid lens; a sensor substrate disposed below the lens assembly and having an image sensor disposed thereon; a connection substrate for electrically connecting the liquid lens and the sensor substrate; and a control unit for supplying a driving voltage applied to the common terminal and the individual terminals, wherein the control unit may sense the voltage applied between the common terminal and the individual terminals, and supply the compensated driving voltage to the common terminal and the individual terminals on the basis on the sensed voltage.

20 Claims, 4 Drawing Sheets

(51) Int. Cl.
*H04N 5/232* (2006.01)
*H05K 1/18* (2006.01)

(52) U.S. Cl.
CPC ......... *H04N 5/23251* (2013.01); *H05K 1/189* (2013.01); *H04N 5/22525* (2018.08); *H05K 2201/10121* (2013.01); *H05K 2201/10151* (2013.01)

(56) References Cited

U.S. PATENT DOCUMENTS

| | | |
|---|---|---|
| 2010/0079032 A1 | 4/2010 | Suzuki |
| 2011/0274372 A1 | 11/2011 | Bianchi et al. |
| 2012/0026596 A1* | 2/2012 | Berge ................... G02B 26/005 359/665 |
| 2014/0017625 A1 | 1/2014 | Liu et al. |
| 2015/0177479 A1 | 6/2015 | Lee et al. |
| 2019/0025587 A1* | 1/2019 | Osterhout .......... G02B 27/0093 |

FOREIGN PATENT DOCUMENTS

| | | |
|---|---|---|
| CN | 102272653 A | 12/2011 |
| CN | 103607942 A | 2/2014 |
| KR | 10-2008-0064235 A | 7/2008 |
| KR | 10-0843473 B1 | 7/2008 |
| KR | 10-0856092 B1 | 9/2008 |
| KR | 10-2016-0022656 A | 3/2016 |

\* cited by examiner

[FIG. 1]
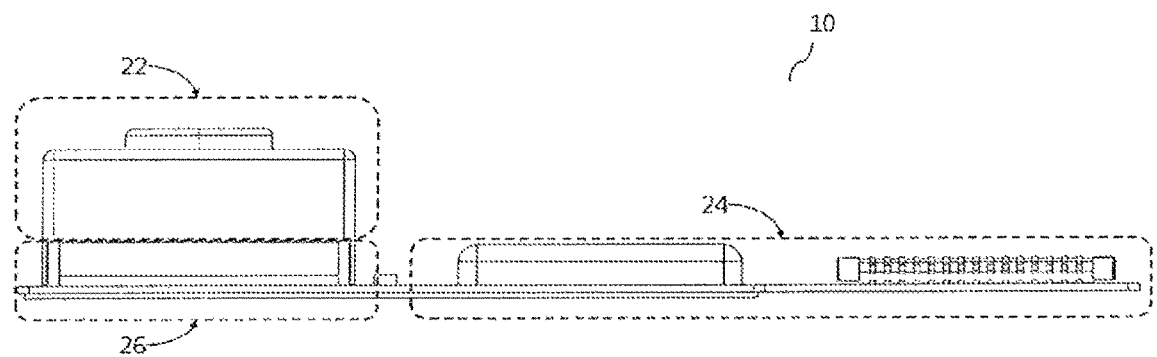
[FIG. 2]
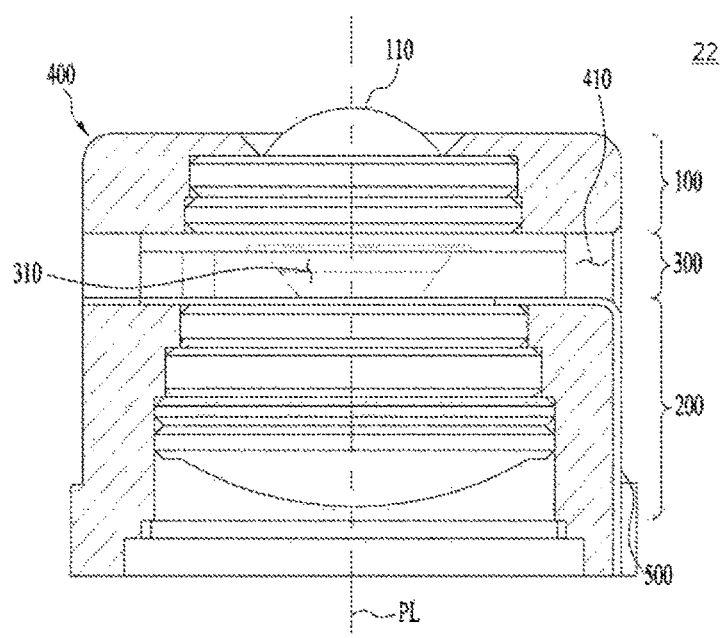

[FIG. 3]
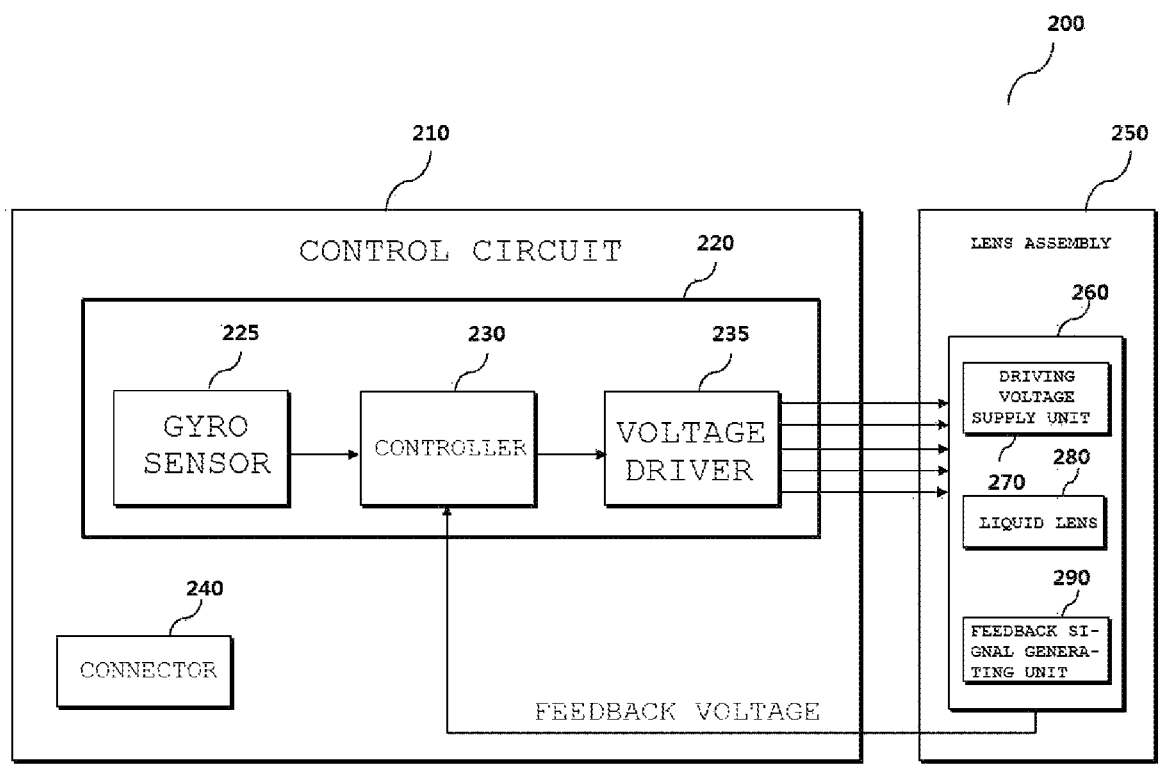
[FIG. 4]
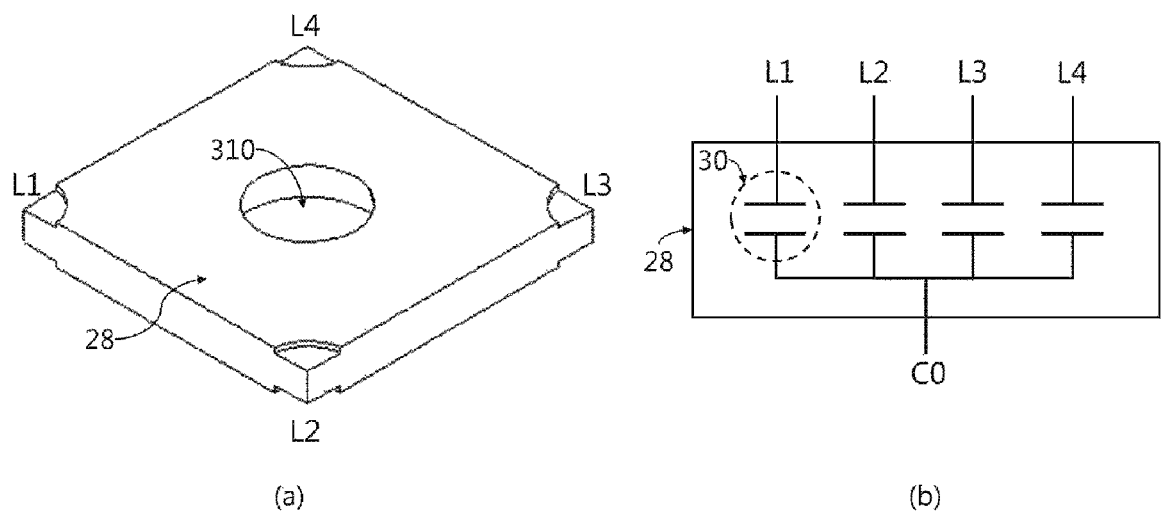
(a)　　　　　　　　　　　　　　(b)

[FIG. 5]
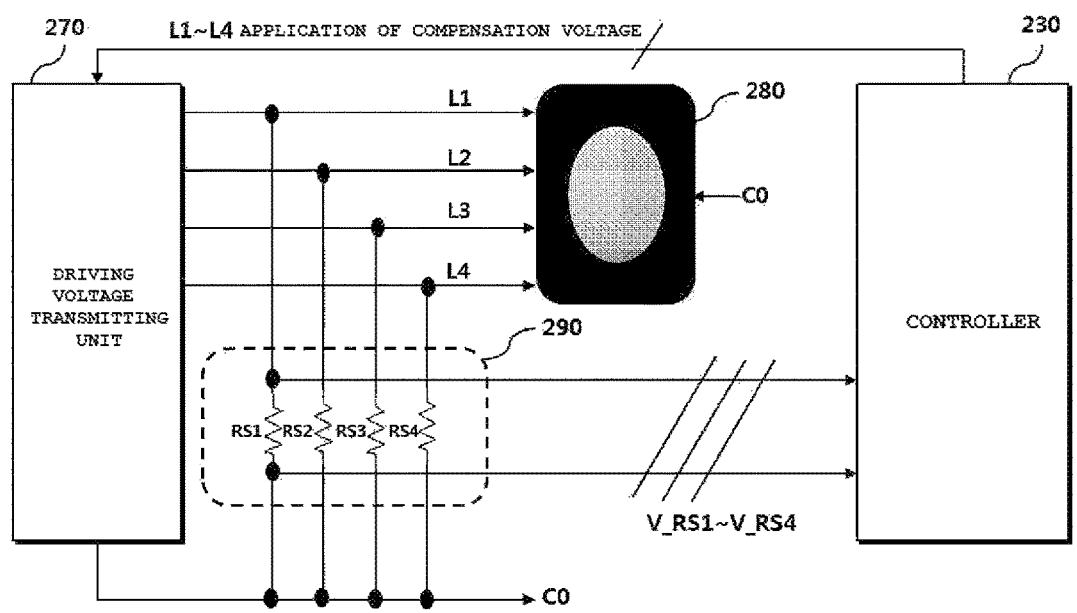

[FIG. 6]
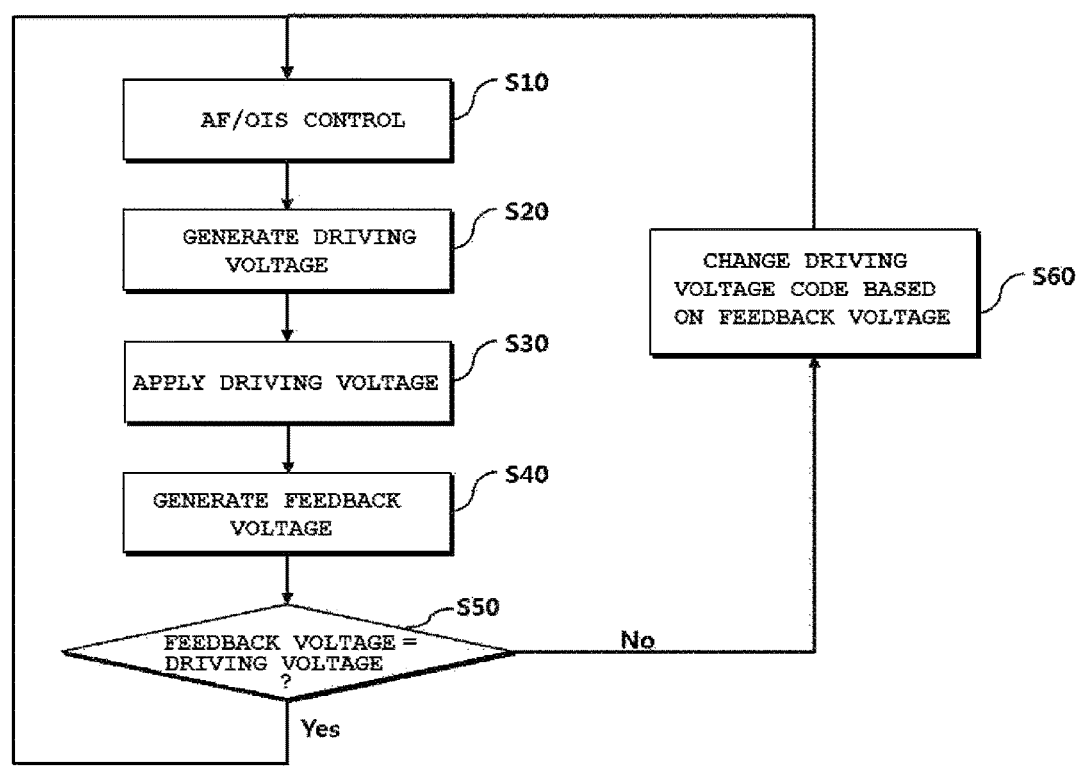

CAMERA MODULE ADJUSTING A DRIVING VOLTAGE APPLIED TO A LIQUID LENS BASED ON A FEEDBACK SIGNAL

CROSS REFERENCE TO RELATED APPLICATIONS

This non-provisional application is a National Stage entry under U.S.C. § 371 of International Application No. PCT/KR2018/000988 filed on Jan. 23, 2018, which claims priority to Patent Application No. 10-2017-0010539 filed in the Republic of Korea on Jan. 23, 2017. The entire contents of all of the above applications are hereby incorporated by reference.

TECHNICAL FIELD

The present disclosure relates to a control circuit, a camera module including the circuit, an optical device including the camera module, and a method for adjusting driving voltage used for camera module. More particularly, the present disclosure relates to a camera module including a lens enabling adjustment of a focal length using electrical energy and an optical device including the camera module.

BACKGROUND ART

People who use portable devices demand optical devices that have high resolution, are small, and have various photographing functions (an optical zoom-in/zoom-out function, an autofocus (AF) function, a hand-tremor compensation or optical image stabilization (OIS) function, etc.). Such photographing functions may be realized by directly moving a plurality of lenses that are combined. In the case in which the number of lenses is increased, however, the size of an optical device may be increased. The autofocus and hand-tremor compensation functions are performed by tilting or moving a lens module including a plurality of lenses, which are fixed to a lens holder in the state in which the optical axes of the lenses are aligned, along the optical axis or in a direction perpendicular to the optical axis. An additional lens moving apparatus is used to move the lens module. However, the lens moving apparatus consumes a lot of power, and an additional cover glass needs to be provided separately from the camera module in order to protect the lens moving apparatus, thus leading to an increase in the overall thickness of an optical device. Therefore, research has been conducted on a liquid lens configured to electrically adjust the curvature of an interface between two kinds of liquid in order to perform autofocus and hand-tremor compensation functions.

DISCLOSURE

Technical Problem

The present disclosure provides a camera module including a lens enabling adjustment of a focal length using electrical energy and capable of improving operational features by sensing a voltage for driving the lens and transmitting the voltage through a feedback path.

However, the objects to be accomplished by the disclosure are not limited to the above-mentioned objects, and other objects not mentioned herein will be clearly understood by those skilled in the art from the following description.

Technical Solution

In one embodiment, a camera module may include a liquid lens including a first plate including a cavity in which a conductive liquid and a non-conductive liquid are disposed so as to form an interface therebetween, a common terminal disposed on the first plate, a plurality of individual terminals disposed under the first plate, a second plate disposed on the common terminal, and a third plate disposed under the individual terminals, a lens assembly including one or more solid lenses and the liquid lens, a sensor substrate on which an image sensor is disposed, the sensor substrate being disposed under the lens assembly, a connection substrate electrically connecting the liquid lens to the sensor substrate, and a control unit supplying a driving voltage to be applied to the common terminal and the individual terminals, wherein the control unit may sense the voltage applied between the common terminal and the individual terminals, and may supply a driving voltage adjusted based on the sensed voltage to the common terminal and the individual terminals.

Depending on the embodiment, the camera module may further include a feedback signal generating unit disposed on the connection substrate, and the feedback signal may be generated by the feedback signal generating unit by sensing the driving voltage applied between the common terminal and the individual terminals.

Depending on the embodiment, the feedback signal generated by the feedback signal generating unit may be transmitted to the control unit so that the driving voltage is adjusted.

Depending on the embodiment, the camera module may further include a feedback signal generating unit configured to generate a feedback voltage by sensing the difference in voltage between any one of the individual terminals and the common terminal.

Depending on the embodiment, the feedback signal generating unit may include a resistor connected to any one of the individual terminals and to the common terminal.

Depending on the embodiment, the connection substrate may be a flexible printed circuit board (FPCB) electrically connecting the liquid lens to the control unit.

Depending on the embodiment, the control unit may include a controller determining a driving voltage code to generate the driving voltage based on a motion signal with respect to an angular velocity of the camera module or based on information about a distance to an object, and a voltage driver generating a driving voltage to be supplied to the common terminal and the individual terminals so as to correspond to the driving voltage code.

Depending on the embodiment, the controller may store a driving voltage table in which the driving voltage code and the driving voltage are mapped.

Depending on the embodiment, the control unit may further include a gyro sensor configured to generate a motion signal with respect to an angular velocity of the camera module and to provide the motion signal to the controller.

In another embodiment, a control circuit may include a controller determining a driving voltage code to generate a driving voltage to be applied between a common terminal and a plurality of individual terminals so as to adjust an interface formed by two or more liquids in a liquid lens, and a voltage driver generating the driving voltage to be supplied to the common terminal and the individual terminals so as to correspond to the driving voltage code, wherein the controller may change the driving voltage code based on a feedback voltage generated by sensing the driving voltage supplied to the common terminal and the individual terminals.

In still another embodiment, a method of adjusting the driving voltage used for a camera module may include determining a driving voltage to control an interface of a liquid lens and a driving voltage code corresponding to the driving voltage based on a user request or a sensing result, generating and applying a driving voltage corresponding to the driving voltage code, generating a feedback voltage by sensing the applied driving voltage, and changing the driving voltage code based on the result of comparing the driving voltage corresponding to the driving voltage code with the feedback voltage.

In still another embodiment, an optical device may include a housing, a display unit disposed in the housing and outputting an image, and a camera module disposed in the housing and capturing an image, wherein the camera module may include a liquid lens including a first plate including a cavity in which a conductive liquid and a non-conductive liquid are disposed so as to form an interface therebetween, a common terminal disposed on the first plate, a plurality of individual terminals disposed under the first plate, a second plate disposed on the common terminal, and a third plate disposed under the individual terminals, a lens assembly including one or more solid lenses and the liquid lens, a sensor substrate on which an image sensor is disposed, the sensor substrate being disposed under the lens assembly, a connection substrate electrically connecting the liquid lens to the sensor substrate, and a control circuit supplying a driving voltage to be applied to the common terminal and the individual terminals, wherein the control circuit may generate a feedback signal and may supply a driving voltage adjusted based on the feedback signal to the common terminal and the individual terminals.

However, the above aspects of the present disclosure are only a part of the exemplary embodiments of the present disclosure, and various embodiments based on technical features of the present disclosure may be devised and understood by those skilled in the art from the following detailed description of the present disclosure.

Advantageous Effects

The effects of a device according to the disclosure will be described below.

A camera module according to an embodiment is capable of adjusting a driving voltage by monitoring the driving voltage actually applied to a liquid lens, thereby reducing a relatively high tolerance (about 5% or more) between a driving voltage code and a driving voltage to a minimum tolerance (about 1% or less).

In addition, since a feedback voltage is generated not only by sensing the voltage of each of individual terminals and a common terminal but also by sensing the difference in the voltage between each of the individual terminals and the common terminal, it is possible to remove common noise, which may be introduced into each terminal, and consequently to more accurately monitor the driving voltage actually applied to a liquid lens.

However, the effects achievable through the disclosure are not limited to the above-mentioned effects, and other effects not mentioned herein will be clearly understood by those skilled in the art from the following description.

DESCRIPTION OF DRAWINGS

FIG. 1 illustrates an example of a camera module according to an embodiment.

FIG. 2 illustrates an example of a lens assembly included in the camera module.

FIG. 3 is a block diagram schematically illustrating the camera module shown in FIG. 1.

FIG. 4 illustrates a lens, the interface of which is adjusted in response to a driving voltage.

FIG. 5 is a view illustrating the operation of a control circuit and a lens assembly associated with a feedback voltage.

FIG. 6 is a flowchart illustrating a method of adjusting a driving voltage using a feedback voltage.

BEST MODE

Reference will now be made in detail to the preferred embodiments, examples of which are illustrated in the accompanying drawings. While the disclosure is subject to various modifications and alternative forms, specific embodiments thereof are shown by way of example in the drawings. However, the disclosure should not be construed as being limited to the embodiments set forth herein, but on the contrary, the disclosure covers all modifications, equivalents, and alternatives falling within the spirit and scope of the embodiments.

It may be understood that, although the terms "first", "second", etc. may be used herein to describe various elements, these elements are not to be limited by these terms. These terms are generally only used to distinguish one element from another. In addition, terms particularly defined in consideration of the construction and operation of the embodiments are used only to describe the embodiments, but do not define the scope of the embodiments.

In the following description of the embodiments, it will be understood that, when each element is referred to as being "on" or "under" another element, it can be "directly" on or under another element or can be "indirectly" formed such that an intervening element is also present. In addition, when an element is referred to as being "on" or "under", "under the element" as well as "on the element" may be included based on the element.

In addition, relational terms, such as "on/upper part/above" and "under/lower part/below", are used only to distinguish between one subject or element and another subject or element without necessarily requiring or involving any physical or logical relationship or sequence between such subjects or elements.

FIG. 1 illustrates an example of a camera module 10 according to an embodiment.

Referring to FIG. 1, the camera module 10 may include a lens assembly 22, a control circuit 24, and an image sensor 26. The lens assembly 22 may include a liquid lens, which enables adjustment of a focal length in response to driving voltages applied between a common terminal and a plurality of individual terminals, and a plurality of solid lenses. The control circuit 24 may be a circuit for supplying driving voltages to the liquid lens. The image sensor 26 may be aligned with the lens assembly 22, and may convert light transmitted through the lens assembly 22 into an electrical signal. The image sensor 26 may be disposed on a sensor substrate, which is disposed at the lower part of the lens assembly 22 or below the lens assembly 22. The camera module 10 may be disposed in a housing together with a display unit or a memory unit capable of storing data, thereby constituting an optical device.

The camera module 10 may include a plurality of circuits 24 and 26, disposed on a single printed circuit board (PCB), and a lens assembly 22 including a plurality of lenses.

However, this is merely illustrative, and the scope of the disclosure is not limited thereto. The configuration of the control circuit 24 may be designed differently in accordance with the specifications required for the camera module 10. In particular, in order to reduce the intensity of the operating voltage applied to the lens assembly 22, the control circuit 24 may be implemented as a single chip. As a result, it is possible to further reduce the size of the camera module 10 that is mounted in a portable device.

FIG. 2 illustrates an example of the lens assembly 22 included in the camera module 10.

Referring to FIG. 2, the lens assembly 22 may include a first lens unit 100, a second lens unit 200, a liquid lens unit 300, a lens holder 400, and a connection unit 500. The illustrated structure of the lens assembly 22 is just one example, and the structure of the lens assembly 22 may be changed depending on the specifications required for the camera module. For example, in the illustrated example, the liquid lens unit 300 is disposed between the first lens unit 100 and the second lens unit 200. However, in another example, the liquid lens unit 300 may be disposed above the first lens unit 100 (or on the front surface of the first lens unit). Further, the second lens unit 200 may be omitted.

The first lens unit 100 is disposed at the front side of the lens assembly 22, and receives light from outside the lens assembly 22. The first lens unit 100 may include at least one lens, or two or more lenses may be aligned along a center axis PL to form an optical system.

The first lens unit 100 and the second lens unit 200 may be mounted in the lens holder 400. Here, a through-hole may be formed in the lens holder 400, and the first lens unit 100 and the second lens unit 200 may be disposed in the through-hole. Further, the liquid lens unit 300 may be inserted into the space between the first lens unit 100 and the second lens unit 200 in the lens holder 400.

Meanwhile, the first lens unit 100 may include an exposure lens 110. Here, the exposure lens 110 is a lens that may protrude so as to be exposed to the outside of the lens holder 400. In the case of the exposure lens 110, the lens surface thereof may be damaged due to exposure to the outside. If the lens surface is damaged, the quality of an image captured by the camera module may be deteriorated. In order to prevent or suppress damage to the surface of the exposure lens 110, a method of disposing a cover glass, a method of forming a coating layer, or a method of forming the exposure lens 110 using a wear-resistant material for preventing damage to the surface of the exposure lens may be applied.

The second lens unit 200 may be disposed at the rear of the first lens unit 100 and the liquid lens unit 300, and the light incident on the first lens unit 100 from the outside may pass through the liquid lens unit 300 and may be incident on the second lens unit 200. The second lens unit 200 may be spaced apart from the first lens unit 100, and may be disposed in the through-hole formed in the lens holder 400.

Meanwhile, the second lens unit 200 may include at least one lens, and when two or more lenses are included, the lenses may be aligned along the center axis PL to form an optical system.

The liquid lens unit 300 may be disposed between the first lens unit 100 and the second lens unit 200, and may be inserted into an insertion hole 410 formed in the lens holder 400. The liquid lens unit 300 may also be aligned along the center axis PL in the same manner as the first lens unit 100 and the second lens unit 200.

A liquid lens of the liquid lens unit 300 may include a first plate, in which a conductive liquid and a non-conductive liquid are disposed, and a plurality of electrodes. In addition, the first plate may include a cavity in which the conductive liquid and the non-conductive liquid are disposed, and the liquid lens of the liquid lens unit 300 may include a common electrode disposed on or under the first plate and an individual electrode disposed under or on the first plate. The liquid lens may include a second plate disposed on the electrode disposed on the first plate and/or a third plate disposed under the electrode disposed under the first plate. The liquid lens unit 300 may include a cavity 310 formed therein. The cavity 310 may be a region that light that has passed through the first lens unit 100 penetrates, and may include a liquid in at least a portion thereof. For example, two kinds of liquid, i.e. a conductive liquid and a non-conductive liquid, may be contained in the cavity 310, and the conductive liquid and the non-conductive liquid may form an interface therebetween without being mixed with each other. The interface between the conductive liquid and the non-conductive liquid may be deformed by a driving voltage applied thereto through the connection unit 500, whereby the curvature of the interface of the liquid lens unit 300 and the focal length of the liquid lens unit may be changed. The connection unit 500 may include one or two or more substrates. Although a single connection unit 500 is illustrated, two connection units may be provided depending on the embodiment. The connection unit 500 may include a connection substrate, and the connection unit 500 may be a flexible printed circuit board (FPCB). When the deformation of the interface and the change in the curvature thereof are controlled, the liquid lens unit 300, the lens assembly 22 including the same, and the camera module may perform an autofocus (AF) function, a hand-tremor compensation or optical image stabilization (OIS) function, etc.

FIG. 3 is a block diagram schematically illustrating the camera module shown in FIG. 1.

FIG. 3 illustrates a control circuit 210 and a lens assembly 250, which are included in the camera module 200, and the control circuit 210 and the lens assembly 250 may respectively correspond to the control circuit 24 and the lens assembly 22 shown in FIG. 1.

The control circuit 210 may include a control unit 220 and a connector 240.

The control unit 220 is a part for performing an AF function and an OIS function. The control unit 220 may control a liquid lens unit 260 included in the lens assembly 250 in response to a user request or a sensing result (e.g. a motion signal of a gyro sensor 225, etc.).

The control unit 220 may include a gyro sensor 225, a controller 230, and a voltage driver 235.

The gyro sensor 225 may sense an angular velocity of motion in two directions, namely a yaw-axis direction and a pitch-axis direction, in order to compensate for hand tremor in the up-down direction and the left-right direction of the camera module 200. The gyro sensor 225 may generate a motion signal corresponding to the sensed angular velocity, and may provide the motion signal to the controller 230.

In order to realize an OIS function, the controller 230 may extract only a desired band by removing a high-frequency noise component from a motion signal using a low-pass filter (LPF), may calculate the amount of hand tremor using the noise-removed motion signal, and may calculate a driving voltage corresponding to the shape that the liquid lens 280 of the liquid lens unit 260 needs to have in order to compensate for the calculated amount of hand tremor.

The controller 230 may receive information (i.e. information about the distance to an object) for performing an AF function from the inside (e.g. an image sensor) or the outside of the camera module 200, and may calculate a driving voltage corresponding to the shape that the liquid lens 280 needs to have in accordance with the focal length for focusing the lens on the object using the distance information.

The controller 230 may store a driving voltage table in which a driving voltage and a driving voltage code for causing the voltage driver 235 to generate the driving voltage are mapped, and may obtain a driving voltage code corresponding to the calculated driving voltage with reference to the driving voltage table.

Further, the controller 230 may receive a feedback voltage supplied from the liquid lens unit 260, may compare the feedback voltage with the driving voltage corresponding to the driving voltage code transmitted to the voltage driver 235 at the previous iteration, and may determine whether to perform a feedback compensation operation. A detailed description of the feedback compensation operation will be made later with reference to FIG. 6.

The voltage driver 235 may receive a digital-type driving voltage code from the controller 230, may generate an analog-type driving voltage corresponding to the received driving voltage code, and may provide the analog-type driving voltage to the lens assembly 250.

The voltage driver 235 may include a voltage booster for receiving a supply voltage (e.g. a voltage supplied from a separate power supply circuit) and increasing a voltage level, a voltage stabilizer for stabilizing the output of the voltage booster, and a switching unit for selectively supplying the output of the voltage booster to respective terminals of the liquid lens 280.

Here, the switching unit may include a circuit called an H-bridge. The high voltage output from the voltage booster is applied to the switching unit as a power supply voltage. The switching unit may selectively supply the applied power supply voltage and a ground voltage across the two ends of the liquid lens 280. Here, the liquid lens 280 may include four individual terminals and one common terminal to realize driving. The two ends of the liquid lens 280 may respectively be any one of the four individual terminals and the one common terminal.

A pulse-type voltage having a predetermined width may be applied to each terminal of the liquid lens 280, and the driving voltage applied to the liquid lens 280 may be the difference between the voltages applied to the common terminal and each of the individual terminals.

That is, in order for the voltage driver 235 to control the driving voltage applied to the liquid lens 280 in accordance with the digital-type driving voltage code supplied from the controller 230, the voltage booster controls the increase in the voltage level, and the switching unit controls the phase of the pulse voltage applied to the common terminal and the individual terminal, whereby an analog-type driving voltage corresponding to the driving voltage code is generated.

The connector 240 may serve as a communication interface between the outside of the control circuit 210 (e.g. the lens assembly) and the inside thereof. For example, the connector 240 may perform communication protocol conversion in order to realize communication between the control circuit 210, which uses an inter-integrated circuit (I²C) communication scheme, and the lens assembly 250, which uses a mobile industry processor interface (MIPI) communication scheme.

Further, the connector 240 may receive power from an external device (e.g. a battery of a mobile device), and may supply power required for the operation of the control unit 220 and the lens assembly 250.

The lens assembly 250 may include a liquid lens unit 260, and the liquid lens unit 260 may include a driving voltage supply unit 270, a liquid lens 280, and a feedback signal generating unit 290.

The driving voltage supply unit 270 may receive driving voltages (i.e. analog voltages corresponding to the four individual terminals and the one common terminal) from the voltage driver 235, and may supply the driving voltages to the liquid lens 280. The driving voltage supply unit 270 may include a voltage-adjusting circuit or a noise-removing circuit for compensating for loss due to terminal connection between the control circuit 210 and the lens assembly 250, or the output voltages may bypass the driving voltage supply unit 270.

The interface of the liquid lens 280 may be deformed in response to a driving voltage, whereby an AF function or an OIS function may be performed.

The feedback signal generating unit 290 may sense the driving voltage applied to the liquid lens 280, and may generate a feedback voltage corresponding to the driving voltage. That is, the feedback voltage may be the driving voltage that is actually applied to the liquid lens 280. The feedback voltage may be a digital signal or an analog signal.

The feedback signal generating unit 290 may provide the feedback voltage to the controller 230. In another embodiment, the feedback signal generating unit 290 may sense a voltage flowing through the front side of the driving voltage supply unit 270 in the lens assembly 250, rather than the voltage flowing between the rear side of the driving voltage supply unit 270 and the liquid lens 280, and may generate a feedback voltage. In still another embodiment, the feedback signal generating unit 290 may be included in the control circuit 210 so as to generate a feedback voltage by sensing an output voltage of the voltage driver 235.

A detailed description of the configuration and the function of the feedback signal generating unit 290 will be made later with reference to FIGS. 5 and 6.

The driving voltage supply unit 260 and the feedback signal generating unit 290 shown in FIG. 3 may be disposed on a flexible printed circuit board (FPCB), which constitutes at least a part of the connection unit 500 shown in FIG. 2. However, the scope of the disclosure is not limited thereto.

FIG. 4 illustrates a lens, the interface of which is adjusted in response to a driving voltage. Specifically, (a) illustrates a liquid lens 28 included in the lens assembly 250 (refer to FIG. 3), and (b) illustrates an equivalent circuit of the liquid lens 28. Here, the liquid lens 28 corresponds to the liquid lens 280 shown in FIG. 3.

First, referring to (a), the liquid lens 28, the interface of which is adjusted in response to a driving voltage, may receive a driving voltage through individual terminals L1, L2, L3 and L4, which are disposed at the same angular interval from each other in four different directions. When the driving voltage is applied to the liquid lens through the individual terminals L1, L2, L3 and L4, the interface between the conductive liquid and the non-conductive liquid disposed in the cavity 310 may be deformed. The degree and shape of deformation of the interface between the conductive liquid and the non-conductive liquid may be controlled by the controller 230 in order to realize an AF function or an OIS function.

Further, referring to (b), the lens 28 may be defined as a plurality of capacitors 30, one side of each of which receives a driving voltage from a corresponding one of the respectively different individual terminals L1, L2, L3 and L4, and the other side of each of which is connected to the common terminal C0. Here, the capacitors 30 included in the equivalent circuit may have a low capacitance of about 200 picofarads (pF).

Although an embodiment in which four individual terminals are provided is described by way of example, the scope of the disclosure is not limited thereto.

FIG. 5 is a view illustrating the operation of the control circuit and the lens assembly associated with a feedback voltage. FIG. 6 is a flowchart illustrating a method of adjusting a driving voltage using a feedback voltage.

Referring to FIGS. 5 and 6, in order to perform an AF function or an OIS function, the controller 230 may determine a driving voltage for controlling the interface of the liquid lens 280 and a driving voltage code corresponding thereto based on a user request or a sensing result (e.g. a motion signal of the gyro sensor 225, etc.) (S10).

Although not illustrated in FIG. 5, the controller 230 may transmit a driving voltage code to the voltage driver 235 so that a driving voltage corresponding to the driving voltage code may be generated (S20). For example, the voltage driver 235 may generate the driving voltage to be supplied to each of the terminals L1 to L4 and C0 in the form of a pulse having a specific voltage level and a specific phase corresponding to the driving voltage code. For convenience of explanation, the embodiment in this specification will be described on the assumption that a pulse signal having a fixed voltage level and phase is input to the common terminal C0, and the shape of the liquid lens 280 is controlled by the voltage level and the phase of the pulse signal supplied to the individual terminals L1 to L4. However, the scope of the disclosure is not limited thereto.

The driving voltage generated by the voltage driver 235 may be transmitted to the driving voltage transmitting unit (or, driving voltage supply unit) 270, and the driving voltage transmitting unit 270 may apply a driving voltage to each of the terminals L1 to L4 and C0 of the liquid lens 280 (S30).

The feedback signal generating unit 290 is used to sense the difference between voltages applied to the two ends of each of the capacitors 30 (refer to FIG. 4). In one embodiment, the feedback signal generating unit 290 may be implemented as a plurality of resistors RS1 to RS4, each of which is connected between a respective one of the individual terminals L1 to L4 and the common terminal C0. Here, the resistance values of the respective resistors RS1 to RS4 are large enough to prevent leakage current from flowing through the respective resistors RS1 to RS4. The resistance values may the same as each other. However, the scope of the disclosure is not limited thereto.

The feedback signal generating unit 290 may sense a driving voltage applied between any one of the individual terminals L1 to L4 and the common terminal C0, and may generate a feedback voltage V_RS1 to V_RS4 (S40). The feedback voltage V_RS1 to V_RS4 is the difference in the voltage between any one of the individual terminals L1 to L4 and the common terminal C0, and the feedback signal generating unit 290 is implemented as a plurality of resistors RS1 to RS4. Thus, the voltages at the two ends of each of the resistors RS1 to RS4 may be transmitted to the controller 230.

As described above with reference to FIG. 3, unlike FIG. 5, the feedback signal generating unit 290 may not directly transmit the voltages at the two ends of each of the resistors RS1 to RS4 to the controller 230, but may generate the result of sensing the voltages at the two ends of each of the resistors RS1 to RS4 in the form of digital data, and may transmit the digital data to the controller 230. According to this embodiment, it is possible to prevent the sensing result from changing in the process of directly transmitting the voltages at the two ends of each of the resistors RS1 to RS4 to the controller 230.

The controller 230 may compare the transmitted feedback voltage with a driving voltage corresponding to the feedback voltage (i.e. a driving voltage inducing the generation of the feedback voltage, e.g. a driving voltage at the previous iteration), and may determine whether the feedback voltage is equal to the driving voltage (S50). The state in which the feedback voltage is equal to the driving voltage may include not only the state in which the feedback voltage is physically completely equal to the driving voltage but also the state in which the difference therebetween is within a predetermined error range.

Here, when the feedback voltage is compared with the driving voltage, the controller 230 may store a driving voltage table in which a driving voltage code and a driving voltage corresponding thereto are mapped. When receiving the feedback voltage, the controller 230 may obtain a driving voltage corresponding to the corresponding driving voltage code from the table. The driving voltage, which is compared with the feedback voltage, is the difference between the voltages applied to the common terminal and each of the individual terminals, and the feedback voltage corresponds to the difference in the voltage between each of the individual terminals and the common terminal. In another embodiment, in the case in which the feedback voltage is determined based on the result of sensing the voltage of each of the individual terminals and the common terminal, the driving voltage, which is compared with the feedback voltage, may be the driving voltage applied to each corresponding individual terminal and the common terminal.

If the feedback voltage is equal to the driving voltage corresponding to the feedback voltage (Yes at S50), the controller 230 may again perform the operation S10 without correcting the driving voltage code.

If the feedback voltage is not equal to the driving voltage corresponding to the feedback voltage (No at S50), the controller 230 may perform a compensation operation in the manner of changing the driving voltage code based on the difference between the feedback voltage and the driving voltage corresponding to the feedback voltage, and may again perform the operation S10 based on the changed driving voltage code (S60).

Specifically, when the feedback voltage is greater than the driving voltage, the controller 230 may change the driving voltage code such that a driving voltage that is lower than the original driving voltage is applied to the liquid lens 280. On the other hand, when the feedback voltage is less than the driving voltage, the controller 230 may change the driving voltage code such that a driving voltage that is higher than the original driving voltage is applied to the liquid lens 280.

At this time, the degree to which the driving voltage code is changed may be determined using the above-described driving voltage table. However, the scope of the disclosure is not limited thereto.

In the case in which the controller 230 determines to perform the compensation operation in the manner of increasing the driving voltage code by 3, if it is determined at S50 that the feedback voltage is equal to the driving voltage, the compensation operation through the increase in the driving voltage code by 3, which has been determined in the first stage, may be continuously maintained.

The camera module according to the embodiment is capable of adjusting a driving voltage by monitoring the driving voltage actually applied to the liquid lens, thereby reducing the relatively high tolerance (about 5% or more)

between the driving voltage code and the driving voltage to a minimum tolerance (about 1% or less).

Further, since a feedback voltage is generated by sensing the difference in the voltage between each of the individual terminals and the common terminal, rather than sensing the voltage of each terminal, it is possible to remove common noise, which may be introduced into each terminal, and consequently to more accurately monitor the driving voltage actually applied to the liquid lens.

Hereinafter, the configuration of a camera module according to an embodiment will be described.

The camera module may include a lens assembly including a liquid lens, an infrared cutoff filter (not shown), a printed circuit board (not shown), an image sensor (not shown), and a controller (not shown). However, any one or more of the infrared cutoff filter and the controller may be omitted from the camera module, or may be modified.

The infrared filter may prevent infrared light from being incident on the image sensor. The infrared filter may be disposed between the lens assembly and the image sensor. The infrared filter may be an infrared absorption filter or an infrared reflection filter. Alternatively, the infrared filter may not be separately disposed, but may be coated or deposited on any one surface of the liquid lens.

The upper surface of the printed circuit board and the liquid lens may be electrically connected to each other. The image sensor may be disposed on the printed circuit board. The printed circuit board may be electrically connected to the image sensor. In one example, a holder member may be disposed between the printed circuit board and the lens assembly. Here, the holder member may accommodate the image sensor therein. The printed circuit board may supply power (current or voltage) to the liquid lens. Meanwhile, the controller for controlling the liquid lens may be disposed on the printed circuit board.

Hereinafter, the configuration of an optical device according to an embodiment will be described.

The optical device may be any one of a mobile phone, a smartphone, a portable smart device, a digital camera, a laptop computer, a digital broadcasting terminal, a personal digital assistant (PDA), a portable multimedia player (PMP), and a navigator. However, the optical device is not limited thereto, but may include any device capable of capturing an image or a picture.

The optical device may include a main body (not shown), a camera module, and a display unit (not shown). However, any one or more of the main body, the camera module, and the display unit may be omitted from the optical device, or may be modified.

Although only a limited number of embodiments have been described above, various other embodiments are possible. The technical contents of the above-described embodiments may be combined into various forms as long as they are not incompatible with one another, and thus may be implemented in new embodiments.

It will be apparent to those skilled in the art that various changes in form and details may be made without departing from the spirit and the essential characteristics of the disclosure set forth herein. Accordingly, the above detailed description is not intended to be construed as limiting the disclosure in all aspects and to be considered by way of example. The scope of the disclosure should be determined by reasonable interpretation of the accompanying claims, and all equivalent modifications made without departing from the disclosure should be included in the scope of the disclosure.

The invention claimed is:

1. A camera module, comprising:
   a lens assembly comprising a first lens unit, a liquid lens, and a second lens unit, the liquid lens comprising:
      a lens plate comprising a cavity including a conductive liquid and a non-conductive liquid;
      a common terminal disposed on a first surface of the lens plate; and
      a plurality of individual terminals disposed on a second surface of lens plate;
   a sensor substrate on which an image sensor is disposed, the sensor substrate being disposed under the lens assembly;
   a control unit applying a driving voltage to the common terminal and the individual terminals so as to adjust an interface between the conductive liquid and the non-conductive liquid of the liquid lens; and
   a feedback signal generating unit sensing a voltage between the common terminal and the individual terminals,
   wherein the control unit applies an adjusted driving voltage to the common terminal and the individual terminals that is adjusted based on a feedback voltage corresponding to a result of the sensed voltage between the common terminal and the individual terminals.

2. The camera module according to claim 1, wherein the feedback signal generating unit senses a difference in voltage between the common terminal and any one of the individual terminals as the feedback voltage, and transmits a feedback signal corresponding to the feedback voltage to the control unit.

3. The camera module according to claim 1,
   wherein the feedback signal generating unit generates a feedback signal corresponding to the sensed feedback voltage.

4. The camera module according to claim 3, wherein the feedback signal generating unit transmits the feedback signal to the control unit so that the driving voltage is adjusted.

5. The camera module according to claim 3, wherein the feedback signal generating unit comprises a resistor connected between any one of the individual terminals and the common terminal.

6. The camera module according to claim 5, wherein the feedback signal generating unit senses a voltage drop of the resistor, converts the sensed voltage drop into a digital data, and outputs the digital data as the feedback signal.

7. The camera module according to claim 3, further comprising:
   a flexible printed circuit board (FPCB) electrically connecting the liquid lens to the control unit.

8. The camera module according to claim 3, wherein the feedback signal generated by the feedback signal generating unit corresponds to a difference of voltage between the common terminal and any one of the individual terminals.

9. The camera module according to claim 3, wherein the control unit comprises:
   a controller determining a driving voltage code to generate the driving voltage based on a motion signal with respect to an angular velocity of the camera module or based on information about a distance to an object; and
   a voltage driver generating the driving voltage to be applied to the common terminal and the individual terminals so as to correspond to the driving voltage code.

10. The camera module according to claim 9, wherein the controller stores a driving voltage table in which the driving voltage code and the driving voltage are mapped.

11. The camera module according to claim 9, wherein the control unit further comprises a gyro sensor configured to generate a motion signal with respect to the angular velocity of the camera module and to provide the motion signal to the controller.

12. The camera module according to claim 9, wherein the lens assembly comprises a driving voltage supply unit receiving the driving voltage from the voltage driver and applying the received driving voltage to the liquid lens.

13. The camera module according to claim 12, wherein the feedback signal generating unit senses the driving voltage applied from the driving voltage supply unit to the liquid lens, and outputs a result of the sensed driving voltage as the feedback signal.

14. The camera module according to claim 12, wherein the feedback signal generating unit senses the driving voltage applied from the voltage driver to the driving voltage supply unit, and outputs a result of the sensed driving voltage as the feedback signal.

15. The camera module according to claim 9, wherein the controller compares the feedback signal and the driving voltage, and changes the driving voltage code in response to a result of the comparison.

16. The camera module according to claim 15, wherein, in response to a level of the feedback signal being greater than a level of the driving voltage, the controller decreases the level of the driving voltage, and changes the driving voltage code to apply the driving voltage having the decreased level to the liquid lens.

17. The camera module according to claim 15, wherein in response to a level of the feedback signal being less than a level of the driving voltage, the controller increases the level of the driving voltage, and changes the driving voltage code to apply the driving voltage having the increased level to the liquid lens.

18. A control circuit, comprising:
a controller determining a driving voltage code to generate a driving voltage to be applied between a common terminal and a plurality of individual terminals so as to adjust an interface formed by two or more liquids in a liquid lens; and
a voltage driver generating the driving voltage to be supplied to the common terminal and the individual terminals, in response to the driving voltage code,
wherein the controller changes the driving voltage code based on a feedback voltage generated by sensing the driving voltage supplied to the common terminal and the individual terminals.

19. A method of adjusting the driving voltage used for a camera module, the method comprising:
determining a driving voltage to control an interface of a liquid lens and a driving voltage code corresponding to the driving voltage based on a user request or a sensing result;
generating and applying a driving voltage corresponding to the driving voltage code;
generating a feedback voltage by sensing the applied driving voltage; and
comparing the driving voltage corresponding to the driving voltage code with the feedback voltage to change the driving voltage code based on the comparing result.

20. An optical device, comprising:
a camera module capturing an image, the camera module including
a lens assembly comprising a first lens unit, a liquid lens, and a second lens unit, the liquid lens comprising:
a lens plate comprising a cavity including a conductive liquid and a non-conductive liquid;
a common terminal disposed on a first surface of the lens plate; and
a plurality of individual terminals disposed on a second surface of lens plate;
a sensor substrate on which an image sensor is disposed, the sensor substrate being disposed under the lens assembly;
a control unit applying a driving voltage to the common terminal and the individual terminals so as to adjust an interface between the conductive liquid and the non-conductive liquid of the liquid lens; and
a feedback generating unit sensing a voltage between the common terminal and the individual terminals,
wherein the control unit applies an adjusted driving voltage to the common terminal and the individual terminals that is adjusted based on a feedback voltage corresponding to a result of the sensed voltage between the common terminal and the individual terminals.

* * * * *